(12) United States Patent
Shook

(10) Patent No.: US 10,439,561 B2
(45) Date of Patent: Oct. 8, 2019

(54) REDUCING OFFSET FROM AN AMPLIFIER OUTPUT WITHOUT A LOW PASS FILTER

(71) Applicant: Texas Instruments Incorporated, Dallas, TX (US)

(72) Inventor: Adam Lee Shook, Carrollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/891,791

(22) Filed: Feb. 8, 2018

(65) Prior Publication Data

US 2018/0254752 A1    Sep. 6, 2018

Related U.S. Application Data

(60) Provisional application No. 62/466,993, filed on Mar. 3, 2017.

(51) Int. Cl.

| H03F 1/02 | (2006.01) |
|---|---|
| H03F 1/26 | (2006.01) |
| H03F 1/30 | (2006.01) |
| H03F 3/38 | (2006.01) |
| H03F 3/393 | (2006.01) |
| H03F 3/45 | (2006.01) |

(52) U.S. Cl.
CPC ............ *H03F 1/26* (2013.01); *H03F 1/30* (2013.01); *H03F 1/303* (2013.01); *H03F 3/38* (2013.01); *H03F 3/393* (2013.01); *H03F 3/45183* (2013.01); *H03F 3/45775* (2013.01); *H03F 2200/375* (2013.01); *H03F 2203/45212* (2013.01)

(58) Field of Classification Search
CPC .............................. H03F 1/02; G11C 27/026
USPC .................................... 330/9; 327/91, 94, 95
See application file for complete search history.

(56) References Cited

U.S. PATENT DOCUMENTS 5,006,819 A  *  4/1991  Buchan ................... H03L 7/091
                                                        327/159

* cited by examiner

*Primary Examiner* — Steven J Mottola
(74) *Attorney, Agent, or Firm* — Ebby Abraham; Charles A. Brill; Frank D. Cimino

(57) ABSTRACT

An output of a first amplifier is coupled to an input of a first track and hold circuit and an input of a second track and hold circuit. An input of a first summing circuit is also coupled to an output of the first track and hold circuit and an output of the second track and hold circuit. In addition, an input of a second summing circuit is coupled to the output of the first track and hold circuit and the output of the second track and hold circuit. Moreover, an input of a third summing circuit coupled to an output of a modulator and an output of the second summing circuit, and an output of the third summing circuit coupled to an input of the first amplifier.

15 Claims, 5 Drawing Sheets

REDUCING OFFSET FROM AN AMPLIFIER OUTPUT WITHOUT A LOW PASS FILTER

PRIORITY

This application claims the benefit, under 35 U.S.C. § 119(e), of U.S. Provisional Patent Application No. 62/466,993, filed Mar. 3, 2017, which is incorporated herein by reference.

TECHNICAL FIELD

This disclosure generally relates to amplifiers, and, in particular, auto-zero amplifiers.

BACKGROUND

The ever-increasing integration between the digital and the analog domains demands analog circuits with stronger performances in terms of precision. This is especially the case in high-gain applications requiring amplifiers. However, amplifiers also introduce errors into the amplified signal, mainly a voltage offset, 1/f noise, and drift. These errors by the amplifier are undesirable. Moreover, many solutions that attempt to remove these errors from the amplified signal incorporate a low pass filter, but the low pass filter may be costly or slow to start up.

SUMMARY OF PARTICULAR EMBODIMENTS

In accordance with this disclosure, a demodulation scheme is provided that may reduce one or more errors introduced by an amplifier without the use of a low pass filter. In certain embodiments, an output of a first amplifier is coupled to an input of a first track and hold circuit and an input of a second track and hold circuit. An input of a first summing circuit is also coupled to an output of the first track and hold circuit and an output of the second track and hold circuit. In addition, an input of a second summing circuit is coupled to the output of the first track and hold circuit and the output of the second track and hold circuit. Moreover, an input of a third summing circuit coupled to an output of a modulator and an output of the second summing circuit, and an output of the third summing circuit coupled to an input of the first amplifier.

DESCRIPTION OF EXAMPLE EMBODIMENTS

The disclosure describes one or more demodulation schemes that may reduce one or more errors introduced by an amplifier. In one embodiment, an output of a first amplifier is coupled to an input of a first track and hold circuit and an input of a second track and hold circuit. An input of a first summing circuit is also coupled to an output of the first track and hold circuit and an output of the second track and hold circuit. In addition, an input of a second summing circuit is coupled to the output of the first track and hold circuit and the output of the second track and hold circuit. Moreover, an input of a third summing circuit coupled to an output of a modulator and an output of the second summing circuit, and an output of the third summing circuit coupled to an input of the first amplifier.

An amplifier may be used to increase the power of a signal. It does this by taking power from a power supply and controlling the output to match the input signal shape but with a larger amplitude. In certain embodiments, an operational amplifier may be used with external feedback components such as resistors and capacitors between its output and input terminals. These feedback components determine the resulting function of the amplifier and by virtue of the different feedback configurations, the amplifier can perform a variety of different operations.

In an amplifier, voltage offset, 1/f noise, and drift are the dominant error sources. The voltage offset may be caused by manufacturing variation or uncertainty in the amplifier. 1/f noise may be low frequency noise for which the noise power is inversely proportional to the frequency. 1/f noise is mainly caused by the defects in the interface between the gate oxide. Drift is also caused by the cross-sensitivity of some error sources to temperature or time.

To reduce the effects of these error sources, auto-zeroing may be used. Auto-zeroing is a discrete-time sampling technique. It involves sampling the offset of the amplifier in one clock phase, and then subtracting it from the input signal in the other clock phase. In addition, if the error changes over time, auto-zeroing will adapt and continue to correct the error.

Figure 1:
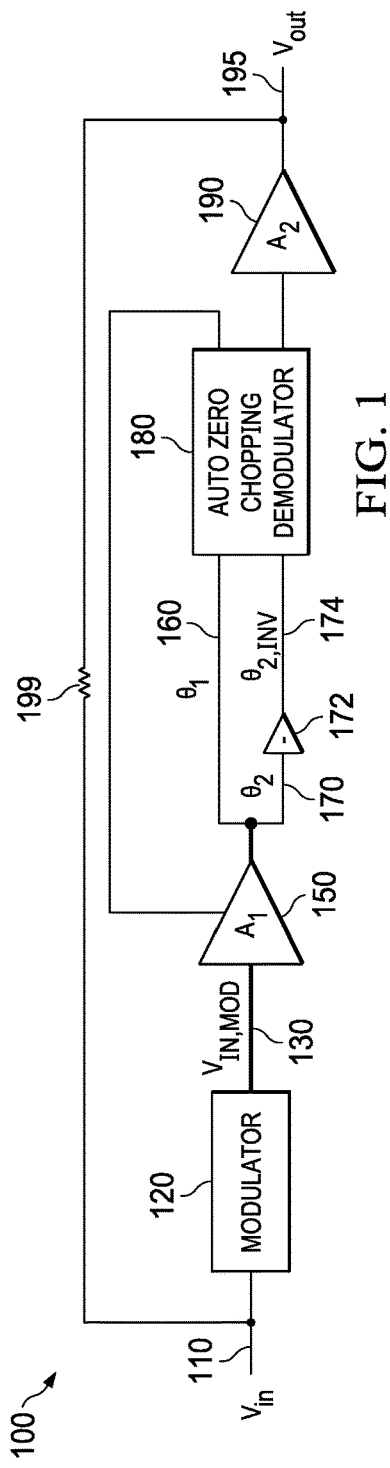
FIG. 1 illustrates a conceptual block diagram of a system architecture incorporating an auto-zero chopping amplifier.

FIG. 1 illustrates a conceptual block diagram of system architecture 100 incorporating an auto-zero chopping amplifier. System architecture 100 may comprise modulator 120, first amplifier 150, inverter 172, auto-zero chopping demodulator 180, second amplifier 190, and feedback element 199. In certain embodiments, the auto-zero chopping amplifier comprises first amplifier 150, inverter 172, auto-zero chopping demodulator 180, second amplifier 190, and feedback element 199. In addition, system architecture 100 may comprise signals, such as input signal ($V_{in}$) 110, differential modulating input signal ($V_{in, MOD}$) 130, $\Theta_1$ 160, $\Theta_2$ 170, $\Theta_{2, INV}$ 174, and output signal ($V_{out}$) 195 that transfer to, from, and/or in between elements in system architecture 100.

$V_{in}$ 110 may be any type of analog input signal. $V_{in}$ 110 may be continuous and may be a representation of a quantity (e.g., audio signal). Typically, $V_{in}$ 110 may use voltage, current, and/or frequency to convey information.

Modulator 120 may be a device or circuit that performs a modulation of $V_{in}$ 110. Modulator 120 may comprise one or more switch arrays to perform the modulation of $V_{in}$ 110. The one or more switch arrays may actively turn on and off at a rate of Ø in modulator 120, thereby creating two different components (e.g., positive and negative polarity) of a differential output. In certain embodiments, a first phase ($Ø_1$) and a second phase ($Ø_2$) are implemented as control signals that control the functioning of the switch arrays in system architecture 100. As an example, during a first phase ($Ø_1$), modulator 120 may output a positive, modulated component of $V_{in}$, hereinafter labeled $V_{in, MOD, POS}$. Similarly, during a second phase ($\emptyset_2$), modulator 120 may output a negative, modulated component of $V_{in}$, hereinafter labeled $V_{in, MOD, NEG}$.

First amplifier 150 may receive one or more components of $V_{in, MOD}$ 130 from modulator 120 and may deliver amplified output signals $\Theta_1$ 160 and $\Theta_2$ 170 that contains the essential waveform features of the input signal. In certain embodiments, first amplifier 150 may also incorporate a summing node that may add or subtract the current and/or voltage from one input signal to the current and/or voltage from another input signal. Undesirably, first amplifier 150 may also introduce voltage offset, 1/f noise, and drift into the signal.

Inverter 172 may be a device or circuit that inverts an input signal. In certain embodiments, inverter 172 may comprise an operational amplifier. Inverter 172 may receive $\Theta_2$ 170 from first amplifier 150 and output an inverted signal $\Theta_{2, INV}$ 174. In some embodiments, inverter 172 may be included in demodulator 180, instead of being external to demodulator 180 as illustrated in FIG. 1.

As described in further detail in FIG. 2 and accompanying description below, auto-zero chopping demodulator 180 helps null voltage offset, 1/f noise, and/or drift that was undesirably introduced by first amplifier 150. Auto-zero chopping demodulator 180 may receive $\Theta_1$ 160 and $\Theta_{2, INV}$ 174 from first amplifier 150 and/or inverter 172. In certain embodiments where auto-zero chopping demodulator 180 comprises inverter 172, auto-zero chopping demodulator 180 may receive $\Theta_1$ 160 and $\Theta_2$ 170 from first amplifier 150.

Auto-zero chopping demodulator 180 may relay the signal to second amplifier 190. In certain embodiments, auto-zero chopping demodulator 180 comprises second amplifier 190. In alternative embodiments, second amplifier 190 is a byproduct of the circuit elements used in auto-zero chopping demodulator 180. The final signal $V_{out}$ 195 is communicated from second amplifier 190 and/or auto-zero chopping demodulator 180. In certain embodiments, second amplifier 190 is connected to a unity gain buffer. A unity gain buffer may have a voltage gain of 1, and may be used as an isolation buffer.

Feedback element 199 may comprise any element capable of controlling gain at first amplifier 150. For example, feedback element 199 may comprise a feedback resistor and/or a feedback capacitor. In certain embodiments, system architecture 100 uses feedback element 199 to control the gain at first amplifier 150. In the illustrated embodiment, feedback element 199 helps set the operating voltage point for an input at first amplifier 150.

In an exemplary embodiment, $V_{in}$ 110 enters modulator 120. Modulator 120 transforms $V_{in}$ 110 into a modulated signal. Typically, modulator 120 contains a switch array that modulates signals during a first phase ($\emptyset_1$) 130 and a second phase ($\emptyset_2$) 140. Because of the switch array in modulator 120, the differential modulating input signal ($V_{in, MOD}$) 130 of modulator 120 may include two different components, $V_{in, MOD, POS}$ and $V_{in, MOD, NEG}$, as defined by the following equations:

$$V_{in,MOD,POS} = +V_{in}$$

$$V_{in,MOD,NEG} = -V_{in}$$

$V_{in, MOD, POS}$ and $V_{in, MOD, NEG}$ enter into first amplifier 150. An inherent characteristic of first amplifier 130 may be that a voltage offset ($V_{OS}$) is unintentionally introduced in first amplifier 150. Accordingly, not only is the modulated signal amplified, but $V_{OS}$ is also amplified. First amplifier 150, therefore, introduces $V_{OS}$ into its output ($\emptyset_1$ 160 and $\emptyset_2$ 170). Accordingly, the output signal of first amplifier with a gain of $A_1$ may comprise the following components:

$$\Theta_1 = (A_1 \cdot V_{in}) + (A_1 \cdot V_{OS}) = A_1 \cdot (V_{in} + V_{OS})$$

$$\Theta_2 = (A_1 \cdot -V_{in}) + (A1 \cdot V_{OS}) = -A1 \cdot (V_{in} - V_{OS})$$

$\Theta_1$ 160 and $\Theta_2$ 170 enter into auto-zero chopping demodulator 180. In certain embodiments, $\Theta_2$ 170 may be inverted by inverter 172 before entering auto-zero chopping demodulator 180 or may be inverted inside auto-zero chopping demodulator 180. If $\Theta_2$ is inverted, $\Theta_{2, INV}$ 174 may comprise the following characteristics:

$$\Theta_{2,INV} = A_1 \cdot (V_{in} - V_{OS})$$

Figure 2:
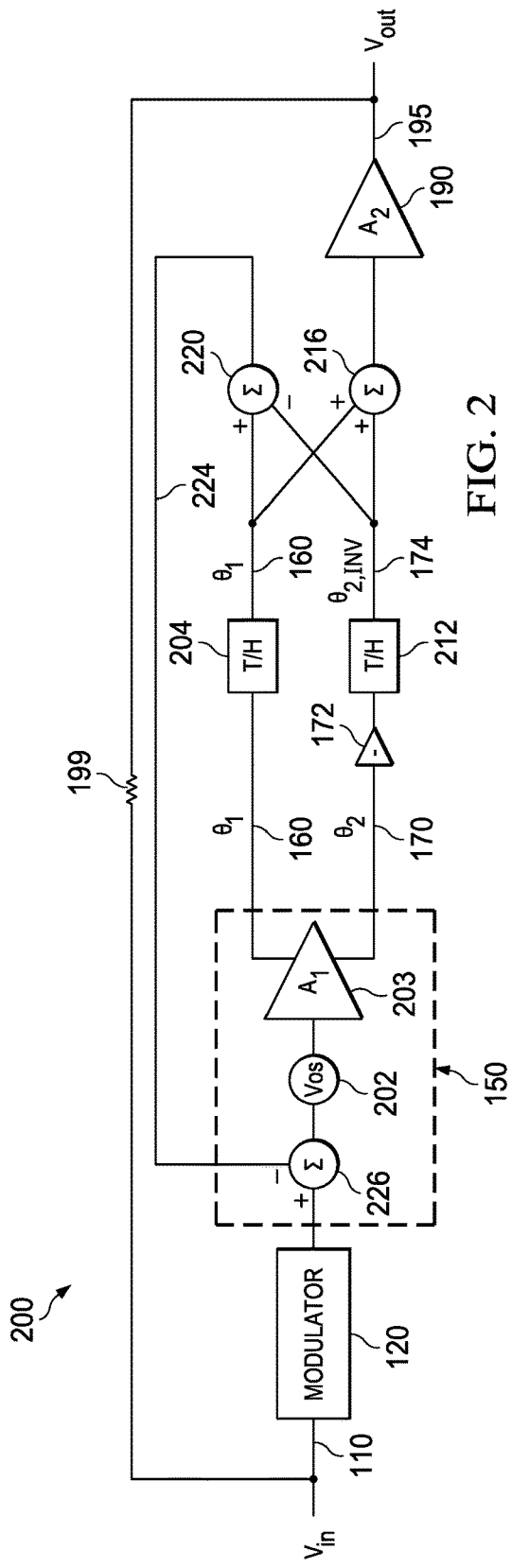
FIG. 2 illustrates a conceptual block diagram of an auto-zero chopping demodulator system.

As discussed in more detail in FIG. 2, auto-zero chopping demodulator 180 removes amplified $V_{OS}$ from $\Theta_1$ 160 and $\Theta_2$ 170 and also demodulates the output of amplifier 150. The signal is then amplified a second time by second amplifier 190. In certain embodiments, second amplifier 190 is internal to auto-zero chopping demodulator 180. Second amplifier 190 then outputs $V_{out}$ 195. In certain embodiments, a feedback loop consisting of feedback element 199 (e.g., feedback resistor or feedback capacitor) and a feedback signal is used to adjust the gain of first amplifier 150.

FIG. 2 illustrates a conceptual block diagram of auto-zero chopping demodulator system 200 in accordance with various examples. Auto-zero chopping demodulator system 200 comprises modulator 120, first amplifier 150, inverter 172, second amplifier 190, feedback element 199, first track and hold circuit 204, second track and hold circuit 212, first summing node 216, second summing node 220, and third summing node 226. In addition, auto-zero chopping demodulator system 200 may comprise signals, such as $V_{in}$ 110, $\Theta_1$ 160, $\Theta_2$ 170, $\Theta_{2, INV}$ 174, and $V_{out}$ 195 that transfer to, from, and/or in between elements in auto-zero chopping demodulator system 200.

While represented as a voltage source, voltage offset ($V_{os}$) 202 represents one or more error sources in first amplifier 150. For example, $V_{os}$ 202 may represent the addition of voltage offset, 1/f noise, and/or drift to the signal.

Amplification circuit 203 represents one or more components in first amplifier 150 that receive one or more components of $V_{in, MOD}$ 130 from modulator 120 and may deliver amplified output signals $\Theta_1$ 160 and $\Theta_2$ 170 that contains the essential waveform features of the input signal. First amplifier 150 may comprise $V_{os}$ 202, amplification circuit 203, and third summing node 226.

First track and hold circuit 204 and second track and hold circuit 212 are sample and hold circuits that sample the voltage and/or current of a signal and holds its value at a constant level for a period of time. As an example, first track and hold circuit 204 and/or second track and hold circuit may comprise a capacitor that stores the electric charge, a switching device such as a field effect transistor switch, and an operational amplifier.

First summing node 216, second summing node 220, and third summing node 226 are summing nodes or circuits that may add or subtract the current and/or voltage from one input signal to the current and/or voltage from another input signal, resulting in an output signal. In certain embodiments, first summing node 216, second summing node 220, and/or third summing node 226 comprise one or more operational amplifiers. First summing node 216, second summing node 220, and/or third summing node 226 may comprise one or more transistors connected to each other in a way so that the current and/or voltage from one input signal adds or subtracts from the current and/or voltage of a second input signal. In the illustrated embodiment, first summing node 216 adds both input signals to create an output signal to second amplifier 190, second summing node 220 adds the input signal from first track and hold circuit 204 and subtracts the input signal from second track and hold circuit 212 to create an output signal to third summing node 226, and third summing node 226 adds the input signal from modulator 120 and subtracts the input signal from second summing node 220 to create an input signal to first amplifier 150. In certain embodiments, third summing node 226 is incorporated into first amplifier 150.

In an exemplary embodiment, modulator 120 receives $V_{in}$ 110. Modulator 120 modulates $V_{in}$ 110 and communicates the output signal to first amplifier 150. As discussed above, first amplifier 150 inherently introduces $V_{os}$, 202 to $V_{in}$ 110, causing both $V_{os}$ 202 and $V_{in}$ 110 to be amplified.

Amplified $V_{os}$, 202 and amplified $V_{in}$ 110 are outputted from first amplifier 150 during two different phases ($\emptyset_1$ and $\emptyset_2$), thereby creating two different signals: $\Theta_1$ 160 and $\Theta_2$ 170. In certain embodiments, a switch array is used to separate the amplified $V_{os}$ 202 and amplified $V_{in}$ 110 into $\Theta_1$ 160 and $\Theta_2$ 170. In mathematical terms, $\Theta_1$ 160 may be represented as $[A_1 \cdot (V_{in} + V_{OS})]$, and $\Theta_2$ 170 may be represented as $[-A_1 \cdot (V_{in} - V_{OS})]$. In the illustrated embodiment, $\Theta_2$ 170 may be further inverted by inverter 172 to create $\Theta_{2, INV}$ 174. $\Theta_{2, INV}$ 174 may be mathematically represented as $[A_1 \cdot (V_{in} - V_{OS})]$.

First track and hold circuit 204 may then sample $\Theta_1$ 160, and second track and hold circuit 212 may then sample $\Theta_{2, INV}$ 174. The output from first track and hold circuit 204 may be a sampled version of $\Theta_1$ 160, and the output from second track and hold circuit 212 may be a sampled version of $\Theta_{2, INV}$ 174. Accordingly, the output from first track and hold circuit 204 may be mathematically represented as $[A_1 \cdot (V_{in} + V_{OS})]$, and the output from second track and hold circuit 212 may be mathematically represented as $[A_1 \cdot (V_{in} - V_{OS})]$.

First summing node 216 may sum the output of first track and hold circuit 204 $[A_1 \cdot (V_{in} + V_{OS})]$ and the output of second track and hold circuit 212 $[A_1 \cdot (V_{in} - V_{OS})]$. The resulting output of first summing node 216, therefore, may be $[2 \cdot A_1 \cdot V_{in}]$. Noticeably, the resulting output may not include $V_{os}$ 202. Second amplifier 150 may amplify resulting output 218, and the resulting signal may be $V_{out}$ 160.

Auto-zero chopping demodulator system 200 may also contain feedback loop 224 to help avoid clipping. Second summing node 220 may subtract the output from second track and hold circuit 212 $[A_1 \cdot (V_{in} - V_{OS})]$ from the output from of first track and hold circuit 204 $[A_1 \cdot (V_{in} + V_{OS})]$. The resulting output 222 from second summing node 220, therefore, is $[2 \cdot A_1 \cdot V_{OS}]$. Noticeably, the resulting output may not include $V_{in}$ 110. The resulting output from second summing node 220 is then subtracted from the modulated input signal at third summing node 226. By subtracting the resulting output from the modulated input signal, auto-zero chopping demodulator system 200 may be able to help prevent $V_{OS}$ from forcing the amplifier output to exceed the positive or negative supply rail.

Moreover, feedback element 199 may be incorporated to help set the operating voltage point for an input at first amplifier 150.

Figure 3:
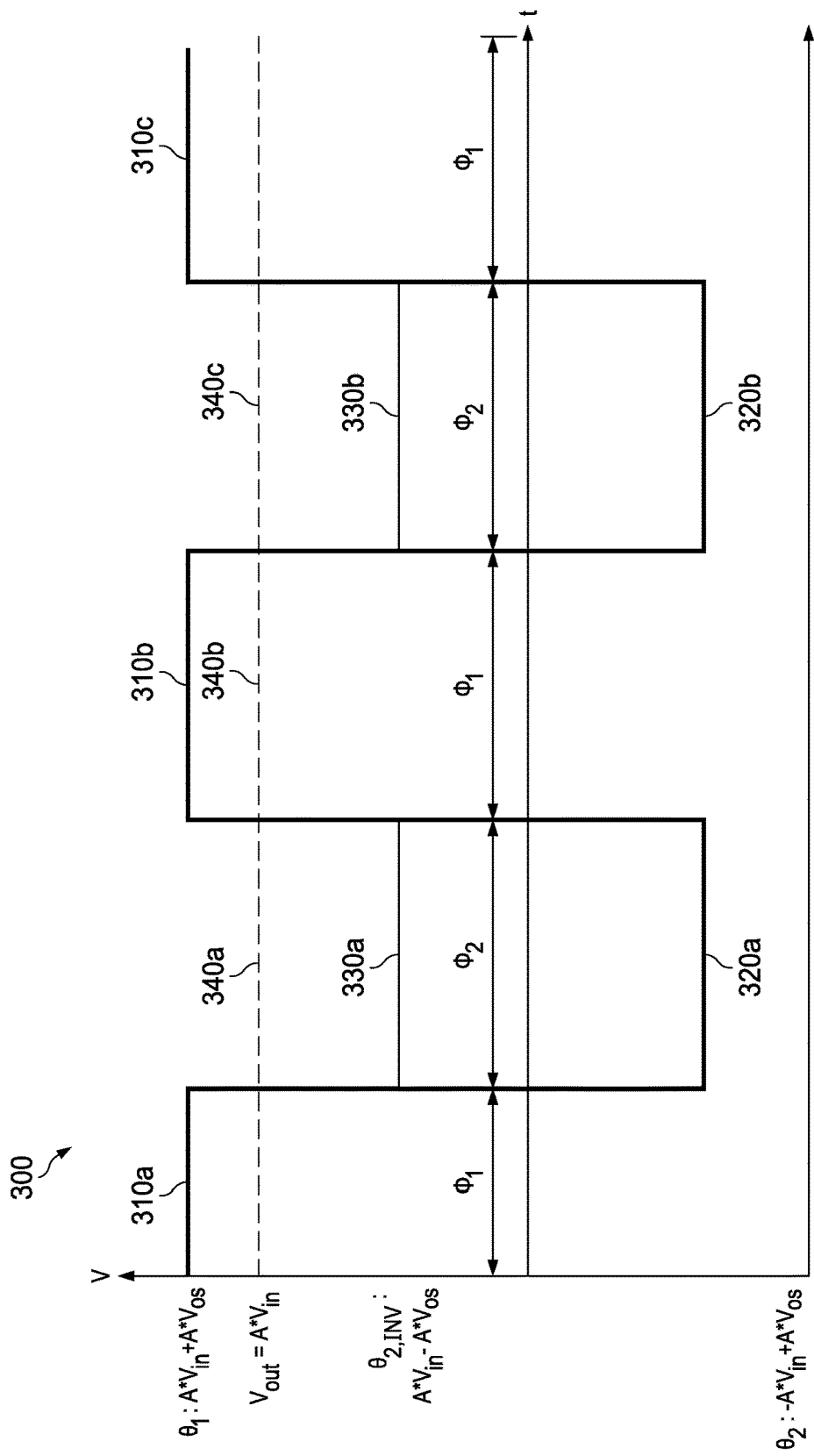
FIG. 3 illustrates a graphical illustration of $\Theta_1$, $\Theta_2$, $\Theta_{2, INV}$, and $V_{out}$ signals in a voltage-time domain graph.

FIG. 3 illustrates a graphical illustration of the $\Theta_1$, $\Theta_2$, $\Theta_{2, INV}$, and $V_{out}$ in a voltage-time domain graph 300. $\Theta_1$ 310a-c illustrate the voltage levels of $\Theta_1$ over time periods $\emptyset_1$. $\Theta_1$ represents the signal outputted during the first phase ($\emptyset_1$) of first amplifier 150. Specifically, $\Theta_1$ may comprise the following voltage level:

$$\Theta_1 = (A_1 \cdot V_{in}) + (A_1 \cdot V_{OS}) = A_1 \cdot (V_{in} - V_{OS})$$

$\Theta_2$ 320a-b illustrate the voltage levels of $\emptyset_2$ over time periods $\emptyset_2$. $\Theta_2$ represents the signal outputted during the second phase ($\emptyset_2$) of first amplifier 150. Specifically, $\Theta_2$ may comprise the following voltage level:

$$\Theta_2 = (A_1 \cdot -V_{in}) + (A_1 \cdot V_{OS}) = -A_1 \cdot V_{in} - V_{OS}$$

$\Theta_{2, INV}$ 330a-b illustrate the voltage levels of $\Theta_{2, INV}$ over time periods $\emptyset_2$. $\Theta_{2, INV}$ represents the negative signal outputted from inverter 172. Specifically, $\Theta_{2, INV}$ comprises the following voltage level:

$$\Theta_{2,INV} = A_1 \cdot (V_{in} - V_{OS})$$

Auto-zero chopping demodulator 180 utilizes track and hold circuits to average the $\Theta_1$ 310a-c and $\Theta_{2, INV}$ 330a-b in order to produce $V_{out}$ 340a-c. For example, auto-zero chopping demodulator 180 may average $\Theta_{2, INV}$ 330a with $\Theta_1$ 310a to produce $V_{out}$ 340a. Similarly, auto-zero chopping demodulator may average $\Theta_{2, INV}$ 330a with $\Theta_1$ 310b to produce $V_{out}$ 340b. As a final example, auto-zero chopping demodulator may average $\Theta_{2, INV}$ 330b with $\Theta_1$ 310b to produce $V_{out}$ 340c. $V_{out}$ 330a-c comprises the following voltage level:

$$V_{out} = A \cdot V_{in}$$

Figure 4:
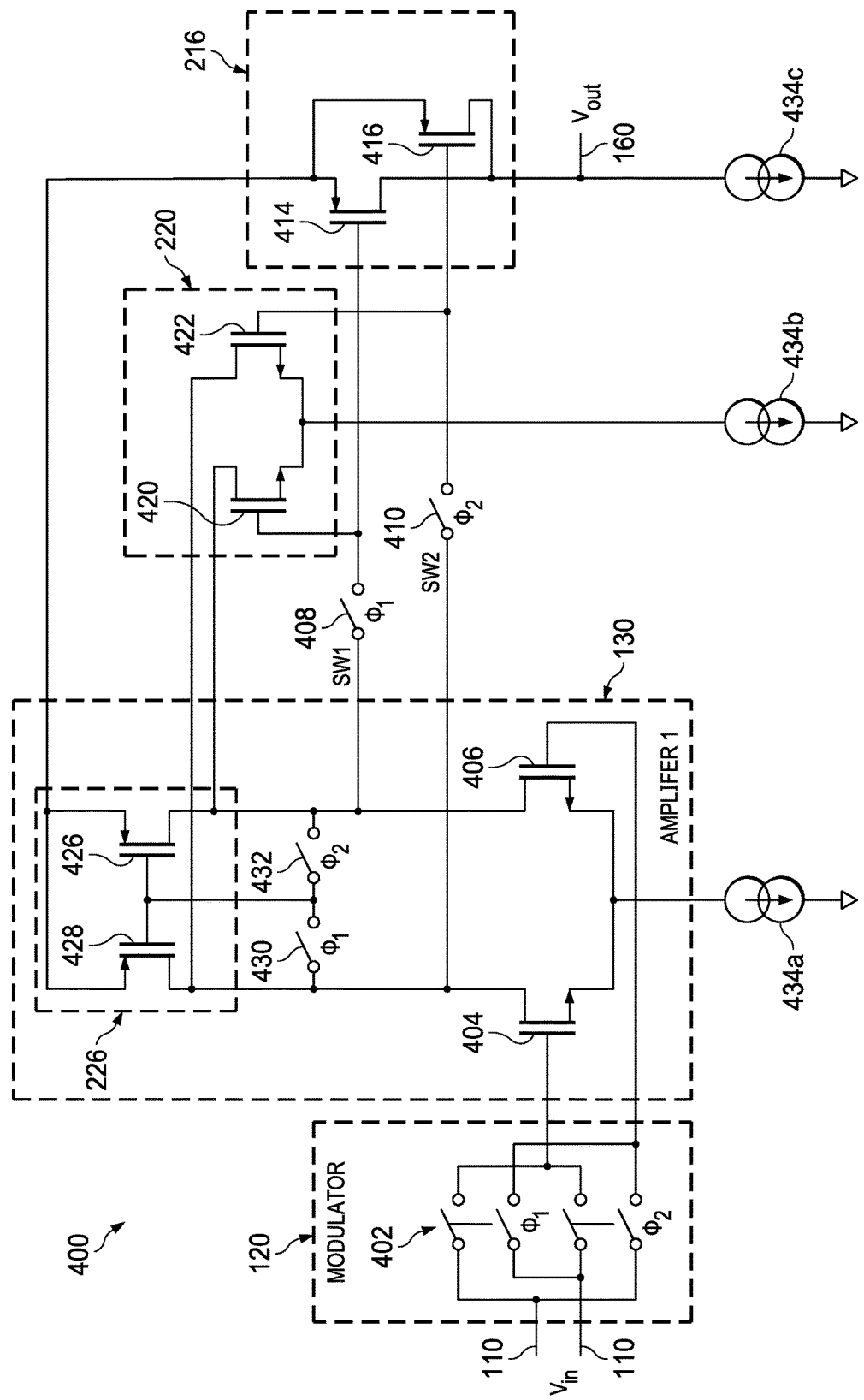
FIG. 4 illustrates an exemplary schematic circuit diagram of an auto-zero chopping amplifier system.

FIG. 4 illustrates a schematic circuit diagram 400 of an illustrative auto-zero chopping amplifier system 200 in accordance with various examples. Circuit diagram 400 may comprise switch array 402, first transistor 404, second transistor 406, first switch 408, second switch 410, third transistor 414, fourth transistor 416, fifth transistor 420, sixth transistor 422, seventh transistor 426, eighth transistor 428, third switch 430, fourth switch 432, and current sources 434a-c.

Typically, a transistor has a control electrode, a first channel electrode, and a second channel electrode. A transistor may be a bipolar junction transistor (BJT) where the control electrode may be a base terminal and the channel electrodes may comprise an emitter terminal and a collector terminal. A transistor may also be a field effect transistor, like a junction field-effect transistor (JFET) or metal-oxide semiconductor field-effect transistor (MOSFET). A field effect transistor may have a control electrode that is a gate terminal and channel electrodes that comprise a source terminal and a drain terminal.

In an embodiment, $V_{in}$ 110 is coupled to modulator 120. Switch array 402 in modulator 120 may be controlled by control signals (e.g., $\emptyset_1$ and $\emptyset_2$). Switch array 402 may transform $V_{in}$ 110 to a modulated signal with two different components: $V_{in, MOD, POS}$ and $V_{in, MOD, NEG}$. $V_{in, MOD, POS}$ may be transmitted to the control electrode of first transistor 404. A channel electrode of first transistor 404 is coupled to current source 434a and another channel electrode of first transistor 404 is coupled to second switch 410, third switch 430, a channel electrode of sixth transistor 422, and a channel electrode of eighth transistor 428. $V_{in, MOD, NEG}$ from modulator 120 is transmitted to the control electrode of second transistor 406. A channel electrode of second transistor 406 is coupled to current source 434a and another channel electrode of second transistor 406 is coupled to first switch 408, fourth switch 432, a channel electrode of fifth transistor 420, and a channel electrode of seventh transistor 426.

First switch 408 is coupled to a control electrode of third transistor 414 and a control electrode of fifth transistor 420. In certain embodiments, first switch 408 may receive the output of first transistor 404 of first amplifier 130. Second switch 410 is coupled to a control electrode of fourth transistor 416 and a control electrode of sixth transistor 422. In certain embodiments, second switch 410 may receive the output of second transistor 406 of first amplifier 130.

A channel electrode of third transistor 414 may be coupled to a channel electrode of fourth transistor 416. In certain embodiments, third transistor 414 and fourth transistor 416 may be a transconductance amplifier. The current flowing from channel electrode of third transistor may combine with the current flowing from the channel electrode of fourth transistor 416 at the junction node coupled to the drains of each of transistors 414 and 416. The summed current may result in output signal $V_{out}$ 160.

In certain embodiments, the combination of third transistor 414 and fourth transistor 416 comprise first summing node 216. Moreover, the combination of first switch 408 with the parasitic capacitance of third transistor 414 and/or fifth transistor 420 may form first track and hold circuit 204. Similarly, the combination of second switch 410 with the parasitic capacitance of fourth transistor 416 and/or sixth transistor 422 may form second track and hold circuit 212.

A channel electrode of fifth transistor 420 may be coupled to a channel electrode of second transistor 406, first switch 408, and fourth switch 432, and a channel electrode of seventh transistor 426. A control electrode of fifth transistor 420 may also be coupled to first switch 408 and third transistor 414. In certain embodiments, a signal from channel electrode of fifth transistor 420 may provide feedback to first amplifier 130.

A channel electrode of sixth transistor 422 may be coupled to a channel electrode of first transistor 404, second switch 410, and a channel electrode of eighth transistor 428. A control electrode of sixth transistor 422 may be coupled to second switch 410 and fourth transistor 416. In certain embodiments, a signal from channel electrode of sixth transistor 422 may provide feedback to first amplifier 130.

A channel electrode of seventh transistor 426 may be coupled to a channel electrode of fifth transistor 420, first switch 408, fourth switch 432, and/or a channel electrode of second transistor 406. A channel electrode of seventh transistor 426 may also be coupled to a channel electrode of eighth transistor 428, channel electrode of third transistor 414, and channel electrode of fourth transistor 416. A control electrode of seventh transistor 426 may be coupled to a control electrode of eighth transistor 428, third switch 430, and fourth switch 432.

A channel electrode of eighth transistor 428 may be coupled to a channel electrode of sixth transistor 422, first switch 410, third switch 430, and a channel electrode of first transistor 404. A channel electrode of eighth transistor 428 may also be coupled to a channel electrode of seventh transistor 426, channel electrode of third transistor 414, and channel electrode of fourth transistor 416. A control electrode of eighth transistor 428 may be coupled to a gate electrode of seventh transistor 426, third switch 430, and fourth switch 432.

Seventh transistor 426 and eighth transistor 428 may be utilized as a current mirror. Moreover, third switch 430 and fourth switch 432 may change the controlling current in the current mirror based on which switch is opened or closed. The current mirror may supply a current to one or more elements in circuit diagram 400.

Third switch 430 may be coupled to channel electrode of first transistor 404, second switch 410, channel electrode of sixth transistor 422, channel electrode of eighth transistor 428, control electrode of seventh transistor 426, and control electrode of eighth transistor 428. Fourth switch 432 may be coupled to channel electrode of second transistor 406, first switch 408, channel electrode of fifth transistor 420, channel of seventh transistor 426, control electrode of seventh transistor 426, and control electrode of eighth transistor 428.

Moreover, circuit diagram 400 may also contain current sources 434a-c. Current sources 434a-c may be any type of electronic equipment that sources or sinks an electric current. In certain embodiments, current sources 434a-c may bias the one or more coupled transistors to establish the desired voltage and/or current for the operation of the one or more coupled transistors.

In an exemplary embodiment, modulator 120 receives $V_{in}$ 110 and outputs a first component of an output of modulator 120 ($V_{in,\ MOD,\ POS}$) and a second component of an output of modulator 120 ($V_{in,\ MOD,\ NEG}$). $V_{in,\ MOD,\ POS}$ enters into a control electrode of first transistor 404, and $V_{in,\ MOD,\ NEG}$ enters into a control electrode of second transistor 406. First transistor 404, second transistor 406, seventh transistor 426, eighth transistor 428, third switch 430, fourth switch 432, and current source 434a may form first amplifier 130. First amplifier 130 may be a transconductance amplifier, a voltage amplifier, or a current feedback operational amplifier. In certain embodiments, a channel electrode (e.g., drain) of first transistor 404 is the positive output of modulator 120, and a channel electrode (e.g., drain) of second transistor 406 is the negative output of modulator 120.

Second switch 410 receives an amplified negative polarity output of modulator 120 ($\Theta_2$ 170) from first amplifier 130, and first switch 408 receives an amplified positive polarity output of modulator 120 ($\Theta_1$ 160). In certain embodiments, the amplified negative polarity output of modulator 120 is inverted ($\Theta_{2,\ INV}$ 174). First switch 408 and the parasitic capacitance of third transistor 414 and parasitic capacitance of fifth transistor 420 create a first track and hold circuit. Similarly, second switch 410 and the parasitic capacitance of fourth transistor 416 and parasitic capacitance of sixth transistor 422 create a second track and hold circuit. In alternative embodiments, a capacitor (e.g., a miller capacitor) may be included in circuit diagram 400 to create the track and hold circuit. When first switch 408 is closed and second switch 410 is open, the track and hold circuit is tracking $\Theta_1$. When first switch 408 is open and second switch 410 is closed, the track and hold circuit is then holding $\Theta_{2,\ INV}$.

First switch 408 transmits the first track-and-hold signal $\Theta_1$ 160 to the control electrode of third transistor 414, and second switch 410 transmits the second track-and-hold signal $\Theta_{2,\ INV}$ 174 to the control electrode of fourth transistor 416. In certain embodiments, the combination of third transistor 414, fourth transistor 416, and current source 434c forms first summing node 216. The current passing through the channel electrodes of third transistor 414 may be proportional to the first track-and-hold signal $\emptyset_1$ voltage. Similarly, the current passing through the channel electrodes of fourth transistor 416 may be proportional to the second track-and-hold signal $\Theta_{2,\ INV}$ voltage. The currents from third transistor 414 and fourth transistor 416 are summed at $V_{out}$ 160.

First switch 408 also transmits the first track-and-hold signal $\Theta_1$ 160 to the control electrode of fifth transistor 420, and second switch 410 transmits the second track-and-hold signal $\Theta_{2,\ INV}$ 174 to the control electrode of sixth transistor 422.

In certain embodiments, the combination of fifth transistor 420 and sixth transistor 422 creates a subtracting node. Fifth transistor 420 and sixth transistor 422 may form a differential pair. A differential current may exist from the current from fifth transistor 420 and sixth transistor 422. For example, the current difference from the channel electrode of fifth transistor 420 and sixth transistor 422 is proportional to the difference between first track-and-hold signal $\Theta_1$ voltage and second track-and-hold signal $\Theta_{2, INV}$ voltage.

Moreover, seventh transistor 426 and eighth transistor 428 may combine to form a current mirror. In addition, third switch 430 and fourth switch 432 may change the controlling current in the current mirror based on which switch is opened or closed. A current mirror may output a similar current from both the channel electrode of seventh transistor 426 and the channel electrode of eighth transistor 428.

In certain embodiments, first switch 408, third switch 430, and one or more switches in switch array 402 may open or close simultaneously. Similarly, in certain embodiments, second switch 410, fourth switch 432, and one or more switches in switch array 402 may open or close simultaneously and/or alternately.

Signals from fifth transistor 420 and sixth transistor 422 are then used as feedback into first transistor 404 and second transistor 406. This feedback helps avoid clipping that may occur in first transistor 404 and second transistor 406. For example, clipping may occur when the input multiplied by the gain is larger than the voltage power supply to operational amplifier.

Each of the components discussed in circuit diagram 400 may be assembled from other components as well, including logic gates, flip flops, amplifiers, current sources, capacitors, resistors, transistors, comparators, and/or oscillators.

Figure 5:
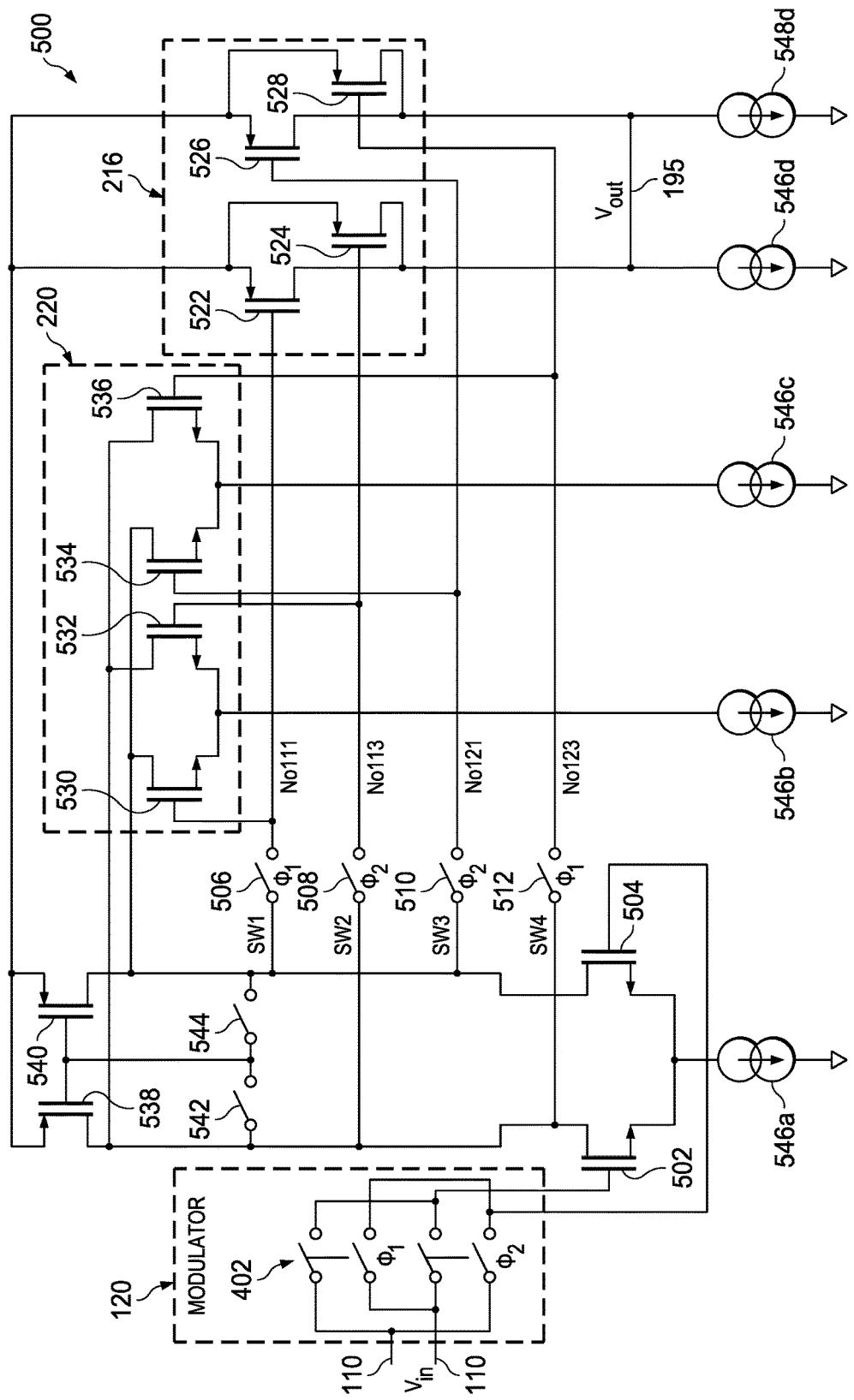
FIG. 5 illustrates an exemplary schematic circuit diagram of a fully-differential auto-zero chopping amplifier system.

FIG. 5 illustrates an exemplary schematic circuit diagram 500 of an illustrative fully-differential auto-zero chopping amplifier system 200 in accordance with various examples. Fully-differential auto-zero chopping amplified system 200 may advantageously be more resistant to unwanted noise coupling on a signal path. Auto-zero offset amplifier in circuit diagram 500 may comprise modulator 120, switch array 402, first transistor 502, second transistor 504, first switch 506, second switch 508, third switch 510, fourth switch 512, third transistor 522, fourth transistor 524, fifth transistor 526, sixth transistor 528, seventh transistor 530, eighth transistor 532, ninth transistor 534, tenth transistor 536, eleventh transistor 538, twelfth transistor 540, fifth switch 542, sixth switch 544, and current sources 546a-d.

In an embodiment, $V_{in}$ 110 is coupled to modulator 120. Switch array 402 in modulator 120 may be controlled by control signals (e.g., $\varnothing_1$ and $\varnothing_2$). Switch array 402 may transform $V_{in}$ 110 to a modulated signal with two different components: $V_{in, MOD, POS}$ and $V_{in, MOD, NEG}$. $V_{in, MOD, POS}$ may be transmitted to the control electrode of first transistor 502. A channel electrode of first transistor 502 may be coupled to current source 546a, and another channel electrode of first transistor 502 may be coupled to second switch 508, fourth switch 512, fifth switch 542, and a channel electrode of eleventh transistor 538. $V_{in, MOD, NEG}$ may be transmitted to the control electrode of second transistor 504. A channel electrode of second transistor 504 may be coupled to current source 546a, and another channel electrode of second transistor 504 may be coupled to first switch 506, third switch 510, sixth switch 544, and a channel electrode of twelfth transistor 540.

First switch 506 may be coupled to a channel electrode of second transistor 504, a control electrode of third transistor 522, a channel electrode of seventh transistor 530, and sixth switch 544. Third switch 510 may be coupled to a channel electrode of second transistor 504, a control electrode of fifth transistor 526, control electrode of ninth transistor 534, and sixth switch 544.

Similarly, second switch 508 may be coupled to a channel electrode of first transistor 502, a control electrode of third transistor 524, a control electrode of eighth transistor 532, and fifth switch 542. Fourth switch 512 may be coupled to a channel electrode of first transistor 502, a control electrode of sixth transistor 528, a control electrode of tenth transistor 536, and fifth switch 542.

The combination of first switch 506, second switch 508, third switch 510, and fourth switch 512 with the capacitance of third transistor 522, fourth transistor 524, fifth transistor 526, and sixth transistor 528, respectively, may form one or more track and hold circuits.

A control electrode of third transistor 522 may be coupled to first switch 506 and control electrode of seventh transistor 530. One or more channel electrodes of third transistor 522 may be coupled to one or more channel electrodes of fourth transistor 524, channel electrode of eleventh transistor 538, and channel electrode of twelfth transistor 540.

A control electrode of fourth transistor 524 may be coupled to second switch 508 and control electrode of eighth transistor 532. One or more channel electrodes of fourth transistor 524 may be coupled to one or more channel electrodes of third transistor 522, channel electrode of eleventh transistor 538, and channel electrode of twelfth transistor 540.

A control electrode of fifth transistor 526 may be coupled to third switch 510 and control electrode of ninth transistor 534. One or more channel electrodes of fifth transistor 526 may be coupled to one or more channel electrodes of sixth transistor 528, channel electrode of eleventh transistor 538, and channel electrode of twelfth transistor 540.

A control electrode of sixth transistor 528 may be coupled to fourth switch 512 and control electrode of tenth transistor 536. One or more channel electrodes of sixth transistor 528 may be coupled to one or more channel electrodes of fifth transistor 526, channel electrode of eleventh transistor 538, and channel electrode of twelfth transistor 540.

In certain embodiments, the combination of third transistor 522, fourth transistor 524, fifth transistor 526, and sixth transistor 528 comprise first summing node 216. In an embodiment, the current stemming from channel electrode of third transistor 522 is combined with the current stemming from the channel electrode of fourth transistor 524. In addition, the current stemming from channel electrode of fifth transistor 526 is combined with the current stemming from the channel electrode of sixth transistor 528. $V_{out}$ 195 may be a differential voltage resulting from the two outputs.

A control electrode of seventh transistor 530 may be coupled to first switch 506 and control electrode of third transistor 522. In addition, one or more channel electrodes of seventh transistor 530 may be coupled to first switch 506, third switch 510, channel electrode of second transistor 504, channel electrode of eighth transistor 532, and channel electrode of ninth transistor 534.

A control electrode of eighth transistor 532 may be coupled to second switch 508 and control electrode of fourth transistor 524. In addition, one or more channel electrodes of eighth transistor 532 may be coupled to second switch 508, fourth switch 512, channel electrode of first transistor 502, channel electrode of seventh transistor 530, and channel electrode of tenth transistor 536.

A control electrode of ninth transistor 534 may be coupled to third switch 510 and control electrode of fifth transistor 526. In addition, one or more channel electrodes of ninth transistor 534 may be coupled to first switch 506, third switch 510, channel electrode of second transistor 504, channel electrode of seventh transistor 530, and channel electrode of tenth transistor 536.

A control electrode of tenth transistor 536 may be coupled to fourth switch 512 and control electrode of sixth transistor 528. In addition, one or more channel electrodes of tenth transistor 536 may be coupled to second switch 508, fourth switch 512, channel electrode of first transistor 502, channel electrode of eighth transistor 532, and channel electrode of ninth transistor 534.

The combination of first switch 506, second switch 508, third switch 510, and fourth switch 512 with the capacitance of third transistor 522, fourth transistor 524, fifth transistor 526, and/or sixth transistor 528 may form one or more track and hold circuits.

One or more channel electrodes of eleventh transistor 538 may be coupled to a channel electrode of first transistor 502, second switch 508, fourth switch 512, a channel electrode of tenth transistor 536, and a channel electrode of twelfth transistor 540. A control electrode of eleventh transistor 538 may be coupled to a control electrode of twelfth transistor 540.

One or more channel electrodes of twelfth transistor 540 may be coupled to a channel electrode of second transistor 504, first switch 506, third switch 510, a channel electrode of ninth transistor 534, and a channel electrode of eleventh transistor 538. A control electrode of twelfth transistor 540 may be coupled to a control electrode of eleventh transistor 538.

In certain embodiments, eleventh transistor 538 and twelfth transistor 540 may combine to form a current mirror. A current mirror may output a similar current from both the channel electrode of eleventh transistor 538 and the channel electrode of twelfth transistor 540.

Fifth switch 542 may be coupled to a channel electrode of first transistor 502, second switch 508, fourth switch 512, a channel electrode of eighth transistor 532, a channel electrode of tenth transistor 536, and a channel electrode of eleventh transistor 538. Fifth switch 542 may also be coupled to a control electrode of eleventh transistor 538, a control electrode of twelfth transistor 540, and sixth switch 544.

Sixth switch 544 may be coupled to a channel electrode of second transistor 504, first switch 506, third switch 510, a channel electrode of seventh transistor 530, a channel electrode of ninth transistor 534, and a channel electrode of twelfth transistor 540.

In an exemplary embodiment, $V_{in}$ 110 is inputted to modulator 120. Modulator 120 may contain switch array 402. Switch array 402 may modulate $V_{in}$ such that $V_{in}$ will be decomposed into phase 1 and phase 2. A portion of the demodulated signal may enter into the control gate of first transistor 502, and a portion of the demodulated signal may enter into the control gate of second transistor 504.

The combination of first transistor 502, second transistor 504, and current source 546a may create an amplification of the inputted signals. For example, the modulated signals voltage may induce a current between the channel electrodes of first transistor 502 and second transistor 504 that is an amplified version of the inputted signals.

The signal coming from the channel electrode of first transistor 502 enters into second switch 508 and fourth switch 512. In certain embodiments, second switch 508 and fourth switch 512 alternately open and close. The signal from second switch 508 and fourth switch 512 enter into the control electrode of fourth transistor 524 and control electrode of sixth transistor 528, respectively.

The combination of first switch 506 and the parasitic capacitance of third transistor 522 and the combination of fourth switch 512 and the parasitic capacitance of sixth transistor 528 may form a first track differential and hold circuit connected to first amplifier 150, the combination of second switch 508 and the parasitic capacitance of fourth transistor 524 and the combination of third switch 510 and the parasitic capacitance of fifth transistor 526 may form a second differential track and hold circuit connected to first amplifier 150, The signal coming from the channel electrode of second transistor 504 enters into first switch 506 and third switch 510. In certain embodiments, first switch 506 and third switch 510 alternately open and close. The signal from first switch 506 and third switch 510 enter into the control electrode of third transistor 522 and fifth transistor 526, respectively.

Third transistor 522, fourth transistor 524, fifth transistor 526, and sixth transistor 528 may form a first summing node 216. In the illustrated embodiment the voltage present at the control electrode of third transistor 522 and fourth transistor 524 creates a current between the electrodes of third transistor 522 and fourth transistor 524. The current from the channel electrodes of third transistor 522 and fourth transistor 524 are then summed. Similarly, the voltage present at the control electrode of fifth transistor 526 and sixth transistor 528 induces a current between the channel electrodes of fifth transistor 526 and sixth transistor 528. The current from the channel electrodes of fifth transistor 526 and sixth transistor 528 are also summed. $V_{out}$ 195 is then taken from the output signal of third transistor 522 and fourth transistor 524 and also the output signal of fifth transistor 526 and sixth transistor 528.

Seventh transistor 530, eighth transistor 532, ninth transistor 534 and tenth transistor 536 may form a subtraction node. In the illustrated embodiment, the signal coming from first switch 506 enters into the control electrode of seventh transistor 530, the signal coming from second switch 508 enters into a control electrode of eighth transistor 532, the signal coming from third switch 510 enters into the control electrode of ninth transistor 534, and the signal coming from fourth switch 512 enters into the control electrode of tenth transistor 536.

The combination of first switch 506 and the parasitic capacitance of seventh transistor 530 and the combination of fourth switch 512 and the parasitic capacitance of tenth transistor 536 may form a first differential track and hold circuit, the combination of second switch 508 and the parasitic capacitance of eighth transistor 532 and the combination of third switch 510 and the parasitic capacitance of ninth transistor 534 may form a second differential track and hold circuit, Moreover, eleventh transistor 538 and twelfth transistor 540 may combine to form a current mirror. A current mirror may output a similar current from the channel electrode of eleventh transistor 538 and the channel electrode of twelfth transistor 540.

In certain embodiments, first switch 506, fourth switch 512, fifth switch 542, and one or more switches in switch array 402 may open or close simultaneously. Similarly, in certain embodiments, second switch 508, third switch 510, sixth switch 544, and one or more switches in switch array 402 may open or close simultaneously.

Signals from seventh transistor 530, eighth transistor 532, ninth transistor 534 and tenth transistor 536 are then used as feedback into first transistor 502 and second transistor 504. This feedback helps avoid clipping that may occur in first transistor 502 and second transistor 504. For example, clipping may occur when the input multiplied by the gain is larger than the voltage power supply to operational amplifier.

Current sources 546a-e are any type of electronic equipment that delivers or absorbs an electric current. In certain embodiments, current sources 546a-e may bias the one or more coupled transistors to establish the desired voltage and or current for the operation of the one or more coupled transistors. In addition, current sources 546a-e may be used as a current to voltage converter to any internal resistance of current sources 546a-e.

Each of the components discussed in circuit diagram 500 may be assembled from other components as well, including logic gates, flip flops, amplifiers, current sources, capacitors, resistors, transistors, comparators, and/or oscillators.

Figure 6:
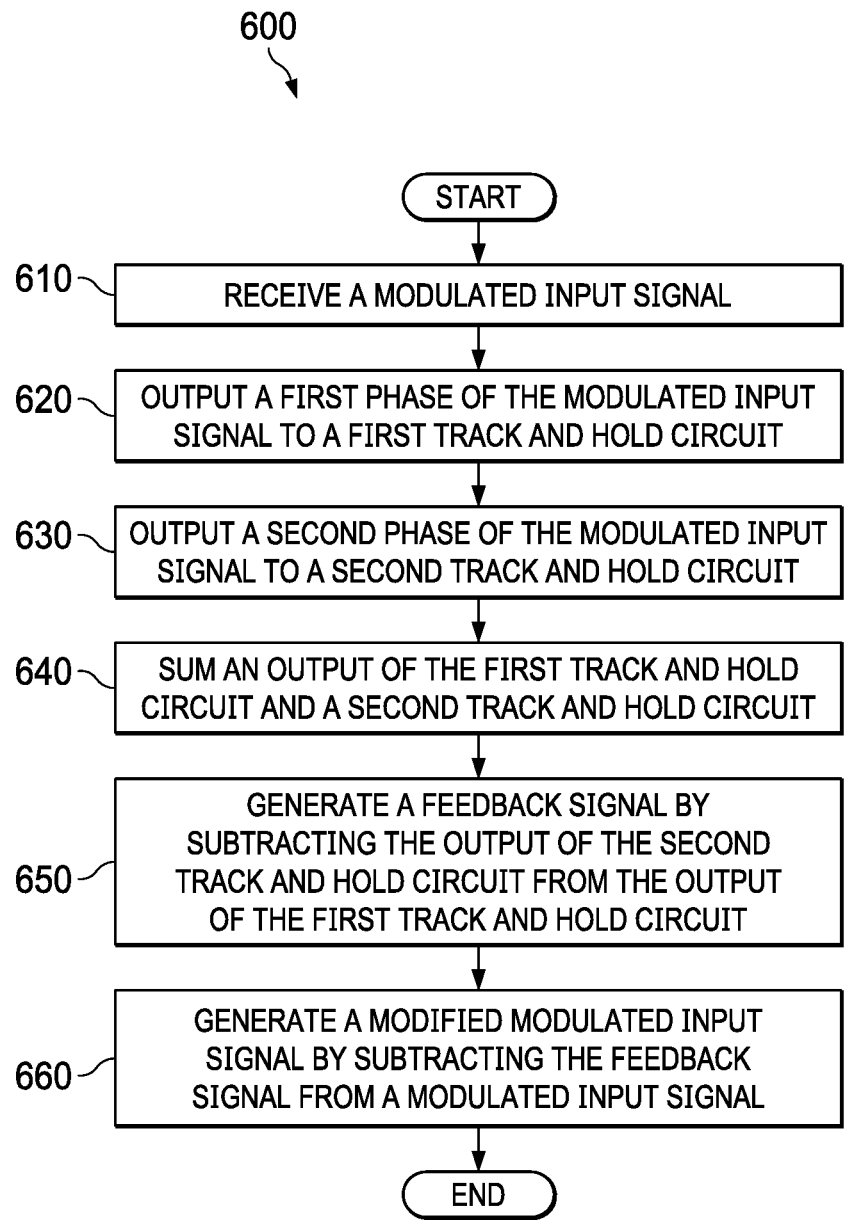
FIG. 6 is an exemplary method to reduce one or more errors introduced by an amplifier without the use of a low pass filter.

FIG. 6 is exemplary flow diagram 600 to reduce one or more errors introduced by an amplifier without the use of a low pass filter.

At step 610, amplifier 150 receives a modulated input signal from modulator 120. In certain embodiments, modulator 120 receives $V_{in}$ 110 and outputs a first component of an output of modulator 120 ($V_{in, MOD, POS}$) and a second component of an output of modulator 120 ($V_{in, MOD, NEG}$). Amplifier 150 may inherently introduce $V_{OS}$ 202 to $V_{in}$ 110, causing $V_{OS}$ 202, $\varnothing_1$ 130, and $\varnothing_2$ 140 to be amplified. The amplified signal may result in the following signals: $\Theta_1$ 160 and $\Theta_2$ 170.

At step 620, amplifier 150 outputs $\Theta_1$ 160 to first track and hold circuit 204. First track and hold circuit 204 may sample $\Theta_1$ 160. At step 630, amplifier 150 may also output $\Theta_2$ 170 to second track and hold circuit 212. In certain embodiments, $\Theta_2$ 170 may be inverted by inverter 172 to create $\Theta_{2, INV}$ 174, and second track and hold circuit 212 may receive $\Theta_{2, INV}$ 174. Similar to first track and hold circuit 204, second track and hold circuit 204 may sample $\Theta_2$ 170 or $\Theta_{2, INV}$ 174.

At step 640, first summing node 216 may sum the output of first track and hold circuit 204 and the output of second track and hold circuit 212. A second amplifier may amplify the resulting output, and the resulting signal may be $V_{out}$ 160.

At step 650, second summing node 220 may generate a feedback signal by subtracting the output from second track and hold circuit 212 from the output of first track and hold circuit 204. At step 660, the resulting feedback signal from second summing node 220 may then be subtracted from the modulated input signal at third summing node 226 in first amplifier 150 to generate a modified modulated input signal.

Particular embodiments may repeat one or more steps of the method of FIG. 6, where appropriate. Although this disclosure describes and illustrates particular steps of the method of FIG. 6 as occurring in a particular order, this disclosure contemplates any suitable steps of the method of FIG. 6 occurring in any suitable order. Moreover, although this disclosure describes and illustrates an example method for reducing one or more errors introduced by an amplifier without the use of a low pass filter including the particular steps of the method of FIG. 6, this disclosure contemplates any suitable method for reducing one or more errors introduced by an amplifier including any suitable steps, which may include all, some, or none of the steps of the method of FIG. 6, where appropriate. Furthermore, although this disclosure describes and illustrates particular components, devices, or systems carrying out particular steps of the method of FIG. 6, this disclosure contemplates any suitable combination of any suitable components, devices, or systems carrying out any suitable steps of the method of FIG. 6.

Moreover, by way of illustration and not of limitation, the accompanying figures show specific embodiments in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. An apparatus, comprising:
a modulator having an output;
an amplifier having a first input, a second input, and an output;
a first track and hold circuit having an input and an output;
a second track and hold circuit having an input and an output;
a first summing circuit having a first input and a second input;
a second summing circuit having a first input, a second input, and an output;
the output of the amplifier coupled to the input of the first track and hold circuit and the input of the second track and hold circuit;
the first input of the first summing circuit coupled to the output of the first track and hold circuit;
the second input of the first summing circuit coupled to the output of the second track and hold circuit;
the first input of the second summing circuit coupled to the output of the first track and hold circuit;
the second input of the second summing circuit coupled to the output of the second track and hold circuit;
the first input of the amplifier coupled to the output of the modulator; and
the second input of the amplifier coupled to the output of the second summing circuit.

2. An apparatus, comprising:
an amplifier having a first output and a second output;
a first track and hold circuit having an input and an output;

a second track and hold circuit having an input;
a summing circuit having a first input and a second input;
the first output of the amplifier coupled to the input of the first track and hold circuit;
the second output of the amplified coupled to the input of the second track and hold circuit; and
the first input of the summing circuit coupled to the output of the first track and hold circuit; and
the second input of the summing circuit coupled to the output of the second track and hold circuit.

3. The apparatus of claim 2, wherein the summing circuit comprises:
a first transistor, wherein a control electrode of the first transistor is coupled to the output of the first track and hold circuit; and
a second transistor, wherein a control electrode of the second transistor is coupled to the output of the second track and hold circuit and a channel electrode of the second transistor is coupled to a channel electrode of the first transistor.

4. The apparatus of claim 2, wherein:
the summing circuit is a first summing circuit; and
the amplifier further has a first input and a second input; and
further comprising:
a second summing circuit having a first input, a second input, and an output;
a modulator having an output;
the first input of the second summing circuit is coupled to the output of the first track and hold circuit;
the second input of the second summing circuit is coupled to the output of the second track and hold circuit;
the first input of the amplifier is coupled to the output of the modulator; and
the second input of the amplifier is coupled to the output of the second summing circuit.

5. The apparatus of claim 4, wherein:
the amplifier is a first amplifier; and
further comprising:
a second amplifier having an input;
the first summing circuit further having an output; and
the output of the first summing circuit is coupled to the input of the second amplifier.

6. The apparatus of claim 5, further comprising:
the second amplifier further having an output; and
the output of the second amplifier is coupled to the modulator via a feedback element.

7. The apparatus of claim 6, wherein the output of the second amplifier is connected to a unity gain buffer.

8. The apparatus of claim 5, wherein the second summing circuit comprises:
a first transistor, wherein a control electrode of the first transistor is coupled to a first track and hold circuit and a channel electrode of the first transistor is coupled to a first input of the amplifier; and
a second transistor, wherein a control electrode of the second transistor is coupled to a second track and hold circuit and a channel electrode of the second transistor is coupled to a second input of the amplifier.

9. A method, comprising:
outputting, from an amplifier, a signal to a first track and hold circuit and a second track and hold circuit;
summing an output of the first track and hold circuit and an output of the second track and hold circuit; and
subtracting the output of the second track and hold circuit from the output of the first track and hold circuit to generate a first feedback signal.

10. The method of claim 9, further comprising:
summing the first feedback signal with a modulated input.

11. The method of claim 9, wherein:
the amplifier comprises a first amplifier; and
further comprising receiving, by a second amplifier, the summation of the output of the first track and hold circuit and the output of the second track and hold circuit.

12. The method of claim 9, further comprising receiving, by a modulator, an output of a second amplifier via a feedback element.

13. The method of claim 12, further comprising, outputting, by the second amplifier, an output to a unity gain buffer.

14. A device comprising circuitry configured to:
output a signal to a first track and hold circuit and a second track and hold circuit;
sum an output of the first track and hold circuit and an output of the second track and hold circuit;
subtract the output of the second track and hold circuit from the output of the first track and hold circuit to generate a first feedback signal.

15. The device of claim 14, wherein the circuitry is further configured to:
sum the first feedback signal with a modulated input.

* * * * *